United States Patent [19]

Boudewijns

[11] Patent Number: 4,726,049
[45] Date of Patent: Feb. 16, 1988

[54] CHARGE-COUPLED DEVICE INPUT WITH COMPLEMENTARY SIGNAL-DEPENDENT CHARGE PACKETS

[75] Inventor: Arnoldus J. J. Boudewijns, Eindhoven, Netherlands

[73] Assignee: U.S. Philips Corporation, New York, N.Y.

[21] Appl. No.: 871,032

[22] Filed: Jun. 5, 1986

[30] Foreign Application Priority Data

Jun. 13, 1985 [NL] Netherlands .......................... 8501702

[51] Int. Cl.⁴ ........................ G11C 19/28; H01L 29/78
[52] U.S. Cl. .......................................... 377/60; 357/24
[58] Field of Search ........................ 357/24; 377/57–63

[56] References Cited

U.S. PATENT DOCUMENTS 4,099,197  7/1978  Ibrahim et al. ........................ 357/24
4,210,825  7/1980  Crochiere et al. .................... 357/24
4,350,902  9/1982  Knauer ................................. 377/60

Primary Examiner—Gene M. Munson
Attorney, Agent, or Firm—Paul R. Miller

[57] ABSTRACT

The invention relates to an input stage for a ccd, which has both a good linearity and favourable high-frequency properties. The input stage comprises a first electrode (18), by which, for example by means of fill and spill, a charge packet (29) of fixed size is formed. Subsequently, viewed in the charge transport direction, three consecutively arranged electrodes (19, 20 and 21) succeed. The fixed charge packet (29) is divided below the electrodes (19 and 21) into two complementary signal-dependent charge packets (30,31), of which the charge packet (30) is transported further and the packet (31) is transferred back to the first electrode (18). The electrode (20) acts as a sampling electrode, which separates the packets (30 and 31) from each other. The signal formation takes place at the edge of the clock with which the sampling electrode is controlled and is therefore independent of the frequency of this clock.

4 Claims, 6 Drawing Figures

CHARGE-COUPLED DEVICE INPUT WITH COMPLEMENTARY SIGNAL-DEPENDENT CHARGE PACKETS

The invention relates to a charge-coupled device comprising a charge transport channel defined at a surface of a semiconductor body and an input stage for supplying signal-dependent charge packets comprising an input diode for supplying charge carriers, a first electrode arranged above the charge transport channel for forming a charge packet having a fixed signal-independent size and second, third and fourth electrodes located above the charge transport channel, the second, third and fourth electrodes being connected to means for applying voltages in such a manner that a potential well extending below these electrodes can be induced, to which the charge packet having a fixed size can be transferred, these means comprising a voltage source, by means of which a signal-dependent voltage difference can be applied between the second and the fourth electrode, as a result of which signal-dependent quantities of charge are stored below the second and the fourth electrode, from which complementary charge packets can be formed by applying such a voltage to the third electrode that below this electrode a potential barrier is formed, which insulates the charge packets below the second and the fourth electrode from each other. Such a charge-coupled device is known, for example, from the publication "A symmetrical Balanced Linear Differential Charge-Splitting Input for Charge-coupled Devices" of Carlo H. Séquin et al, published in I.E.E.E. Transactions on Electron Devices, Vol. ED-24, No. 6, June 1977, p. 746–750. FIG. 4 of this publication shows a device which is suitable for those applications in which only one of the two signal-dependent charge packets formed below the second and the fourth electrode is transported further for further signal processing, whereas the other charge packet is drained. In order to permit of realizing this mode of operation, the device is provided with an input stage, which, as far as at least the part comprising the input diode and the first electrode is concerned, is arranged at right angles to the remaining part of the charge transport channel. The second, third and fourth electrodes are located at the area at which both parts meet. The charge packets below the second or the fourth electrode can be transported further in different directions, i.e. to a drain zone for one packet and to a reading member for the other packet.

In this configuration, in order to be transferred from one (the vertical) part to the other (horizontal) part, the charge has to pass a narrow channel, whose width is determined by the length of the second and fourth electrodes. Due to the fact that in charge-coupled devices the width-to-length ratio is generally considerably larger than 1, the charge transport from the vertical part to the horizontal part involves a considerable decrease of speed. This means that in general the frequency at which this device can be operated lies considerably lower than the frequency at which the normal charge transport in the horizontal part could be effected. The transport from the vertical part to the horizontal part could be accelerated by making the lengths of the second and fourth electrodes considerably greater. However, such an increase in length would have a speed-reducing effect on the horizontal part.

The invention has inter alia for its object to provide a charge-coupled device of the kind described in the opening paragraph, in which this limitation of frequency is avoided.

The invention is based on the recognition of the fact that the signal-dependent charge packet formed below the second electrode and no longer transported for further signal processing through the charge-coupled device can be transferred back to the region below the first electrode.

A charge-coupled device according to the invention is characterized in that the electrodes are disposed one to four in a consecutive arrangement in such a manner that the second electrode is located between the first and third electrodes, and in that means are provided for transferring the charge packet formed below the second electrode back to the region below the first electrode before a charge packet having a fixed size is formed again below this electrode.

Due to the fact that the excess charge packet is stored again below the first electrode, this charge packet need not be drained separately. The electrodes can now all be arranged consecutively, as a result of which the reductions in speed described above are avoided.

An important preferred embodiment is characterized in that the signal-dependent voltage difference between the second and the fourth electrode is obtained from a signal S, which is supplied in the form $+S$ to one of the electrodes and in the form $-S$ to the other of the electrodes.

The invention will be described more fully with reference to an embodiment and the accompanying diagrammatic drawing, in which.

Figure 1:
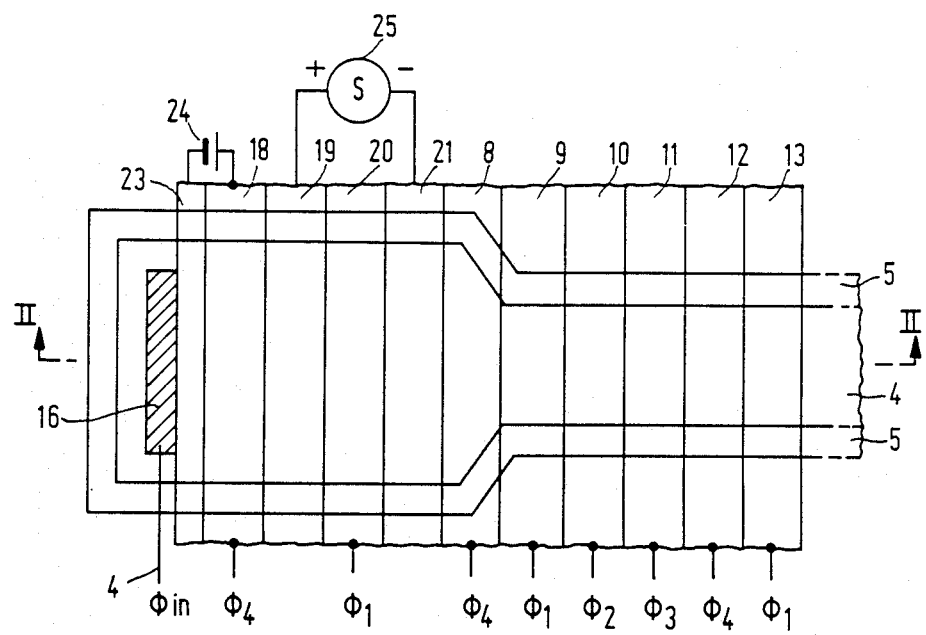
FIG. 1 is a plan view of a part of a charge-coupled device according to the invention.

The invention will be described hereinafter with reference to an n-channel device, but it will be appreciated without further explanation that the invention can also be used for p-channel devices.

The device comprises a semiconductor body 1 of, for example, silicon having at least a surface region 3 of the p-type adjoining a surface 2. In usual embodiments, the whole body 1 will be of the p-type, but this is not necessary. In the usual manner, the charge transport channel 4 is defined by the surface zone 5, which is provided in the surface region 3 and has the same conductivity type as and is more highly doped than the surface region 3 and forms a channel-limiting zone for the charge transport channel 4. Instead of the zone 5, of course, other known channellimiting means may also be used.

The surface 2 above the charge transport channel is covered with a thin dielectric layer 6 of, for example, silicon oxide and/or silicon nitride or another suitable material or of a combination of suitable dielectric materials.

Figure 2:
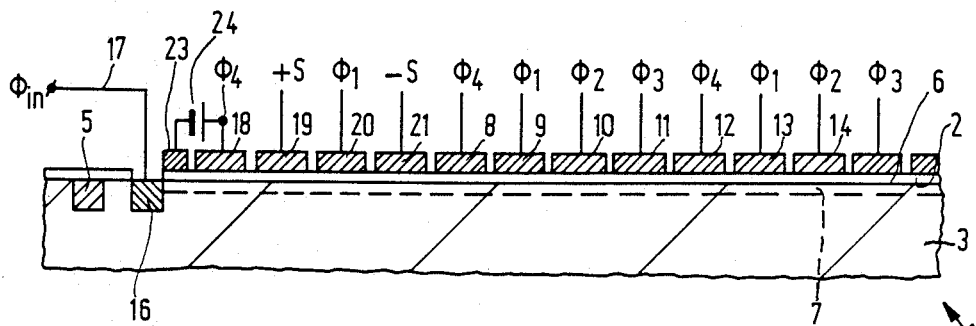
FIG. 2 is a sectional view of this device taken on the line II—II in FIG. 1.

In the case in which the device belongs to the type of devices having a buried channel (bccd or pccd), a thin n-type layer 7 (indicated in FIG. 2 by broken lines) can be provided in the charge transport channel 4, for example by ion implantation. This layer can be omitted in the case of a surface ccd (sccd).

As appears from the plan view of FIG. 1, the charge transport channel has a part of larger width and a part of smaller width. The wider part is associated with the input, which will be described more fully. The part of smaller width forms the actual charge transport channel between the input and the output (not shown). The charge transport in this part is controlled by 4-phase clock voltages $\phi_1$, $\phi_2$, $\phi_3$ and $\phi_4$, which are applied to the clock electrodes 8, 9, 10, 11, 12, 13, 14 and 2 provided on the oxide layer 6.

The input stage comprises an n+ surface zone 16, which is provided in the p-type surface region 3 and serves to form electrodes, which are necessary for producing signal-dependent charge packets. This zone, which is designated hereinafter as input diode, is provided with a connection 17 shown only diagrammatically. By this connection, the clock voltage $\phi_{in}$ is supplied to the input diode.

There are arranged between the input diode 16 and the clock electrode 8 four electrodes 18–21, which will be designated hereinafter as first, second, third and fourth electrode and which have the following functions: the first electrode, i.e. the electrode 18, serves to induce in the subjacent part of the channel 4 a potential well (for electrons), in which a charge packet having a fixed and signal-independent size can be stored. As will be explained hereinafter, this fixed charge packet is formed by means of the so-called "fill and spill method" known per se, for which purpose there is arranged between the input diode 16 and the electrode 18 a further electrode 23, which is provided with means 24 for inducing a potential barrier between the input diode 16 and the potential well to be induced below the electrode 18. In the present embodiment, the means 24 comprise a voltage source, by means of which a fixed potential difference can be applied between the electrodes 18 and 23, the electrode 18 being connected to the positive terminal of the voltage source 24 and the electrode 23 being connected to the negative terminal. Instead of the voltage source 24, other known means for forming the desired potential barriers may also be used, such as a suitably chosen thickness of the oxide layer 6 below the electrode 23 or an ion implantation in the channel 4 below the electrode 23. The electrodes 18, 23 are clocked by the clock voltage $\phi_4$.

The electrodes 19, 20 and 21 serve to divide the charge packet having a fixed size into two complementary signaldependent charge packets. These charge packets are formed by the electrodes 19 and 21 and are separated from each other by means of the electrode 20. For this purpose, a voltage dependent upon the signal S to be supplied is applied between the electrodes 19 and 21. This is indicated diagrammatically in FIG. 1 by the source 25, whose positive terminal is connected to the electrode 19 and whose negative terminal is connected to the electrode 21. Of course, the voltage source 25 may also be connected in the opposite sense or one of its terminals may be connected to a fixed voltage. The electrode 20 is clocked with the clock voltage $\phi_1$.

Figure 3A:
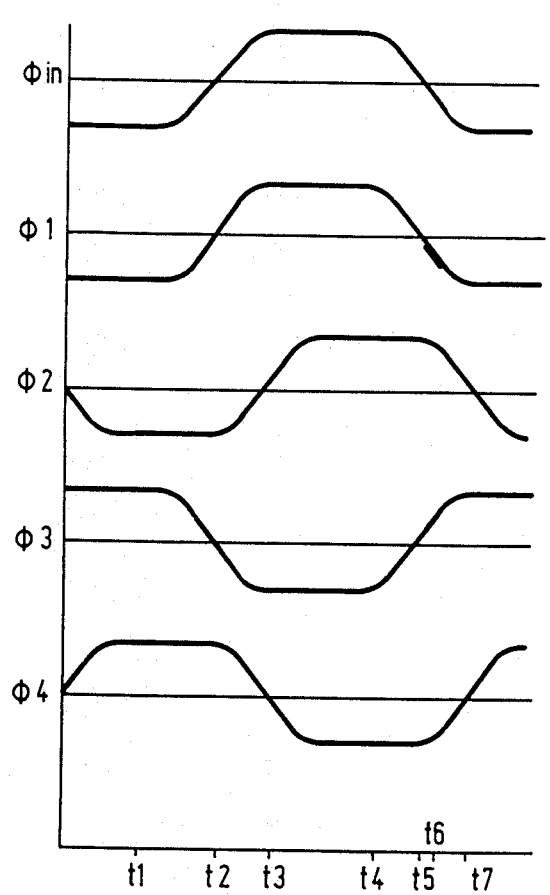
FIGS. 3a and 3b show as a function of the time t clock voltages applied during operation to the device shown in FIG. 1.
Figure 4A:
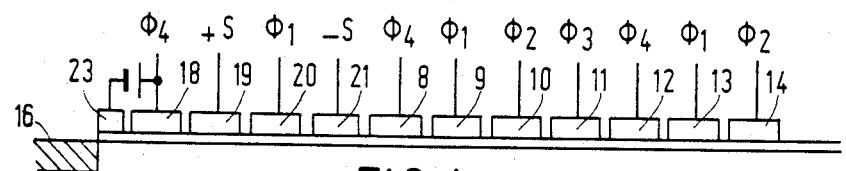
FIGS. 4a and 4b show the potential distributions occurring at these clock voltages in the charge transport at different instants.
Figure 4B:
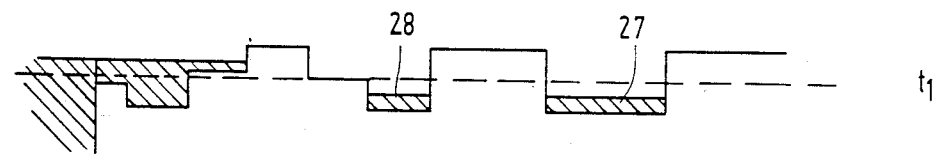

The operation of the charge-coupled device is described with reference to the potential diagrams shown in FIG. 4, which occur in the charge transport channel upon application of the clock voltages according to FIG. 3a. FIG. 4a shows diagrammatically for the location in the diagram the input stage of the device and the part of the succeeding charge transport channel 4. As usual, the positive potential is plotted in downward direction. The potential level below the electrodes at a voltage of 0 V at the electrodes is indicated in the diagrams by the broken line and is designated below as reference level. It is assumed that the semiconductor body 1 or at least the surface region 3 is applied to a negative voltage of, for example, −3.5 V. The clock voltages $\phi_{in}$ and $\phi_1$, $\phi_2$, $\phi_3$ and $\phi_4$ vary around the zero level. The clock voltage $\phi_{in}$ is synchronous with $\phi_1$, but may differ from it in amplitude. At the instant $t_1$, $\phi_4$ is positive and $\phi_{in}$ is negative. Below the electrode 18, a potential well is induced, which is filled due to the negative voltage at the input diode 6 with an excess quantity of charge carriers. In the drawing, the charge is indicated symbolically by the hatched lines. Below the electrodes 8 and 11, 12, which are applied to a positive voltage, charge packets 27 and 28, respectively, are stored, which have been introduced before the instant $t_1$. Below the electrodes, which are connected to $\phi_1$ and are applied to a negative potential, potential barriers are formed, which insulate the charge packets in the channel 4 from each other.

It should be noted that the potential levels below the electrodes 19 and 21 are indicated slightly differently due to the signal S to be converted.

At the instant $t_2$, $\phi_{in}$ has increased above the reference level, which means that in the potential diagram the potential of the input diode is located below the broken line. The excess quantity of charge carriers supplied flows back to the input diode 16. In the potential well below the electrode 18, a charge packet 29 is left, whose size is fixed and is determined only by the height of the barrier below the electrode 23. The charge packets 27 and 28 remain below the electrodes 8 and 12 clocked with $\phi_4$. The electrodes 10 and 14, which are clocked with $\phi_2$, remain negative, as a result of which a barrier remains present below these electrodes. Below the clock electrodes 9 and 13, like below the electrode 20, which are clocked with $\phi_1$, the potential level has returned to the reference level.

At $t_3$, the input diode has arrived at the most positive level. At the same time, $\phi_1$ has become positive, while $\phi_4$ has returned to 0 V. The packet 29 is transferred at least in part to the potential well below the electrode 20. The charge packets 27 and 28 are shifted one position with respect to the situation at $t_2$.

At $t_4$, $\phi_4$ is negative. Below the electrodes connected to $\phi_4$ a potential barrier has now been formed. The charge 29, which was stored at $t_1$, $t_2$ below the electrode 18, is now present below the electrode 20. At the same time, the potential wells in which the packets 27 and 28 are stored have extended to beneath the clock electrodes 10, 14.

At $t_5$, $\phi_1$ has fallen again to 0 V so that the charge packets 27, 28 are stored below the electrodes 10 and 14 connected to $\phi_2$ and are again shifted one position with respect to the situation at $t_3$. The charge packet 29 can extend over a potential well, which covers the area below the electrodes 19, 20 and 21. The quantity of charge stored below the electrodes 19 and 21 in this situation depends upon the depth of the potential well below the electrodes 19 and 21, respectively, and hence upon the value of the signal S.

From the instant $t_5$, $\phi_1$ becomes negative, as a result of which the potential level below the electrode 20 increases and the charge that was stored below the electrode 20 is distributed over the potential wells below the electrodes 19 and 21. At the instant $t_6$, the charge packet 29 is subdivided into two charge packets 30 and 31, which are separated from each other by the potential barrier 32 below the electrode 20. The sizes of the charge packets 30 and 31 are complementary and dependent upon the signal S. In the present embodiment, in which, by way of example, the level below the electrode 19 is indicated to be slightly higher than below the electrode 21, the charge packet 30 will be largest.

Figure 3B:
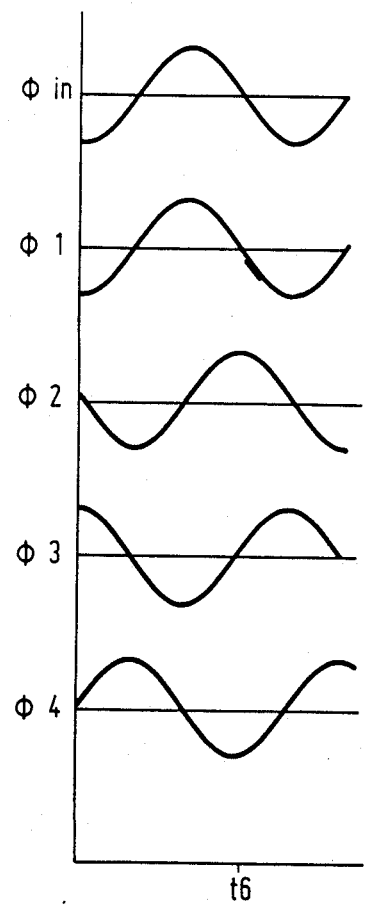

At the next stage of operation, only the charge packet 30 will be transported further through the charge transport channel. At the instant $t_7$, $\phi_4$ is 0 V. The charge packet 31 is thus transferred at least in part back to the region below the electrode 18, while the charge packet 30 extends below the clock electrode 8, which is also clocked with $\phi_4$. The charge packet 30 can be transported further through the charge transport channel 4 in the same manner as the charge packets 27 and 28. The charge packet 31 is not drained, but is added to the excess quantity of charge carriers which are supplied by the input diode 16 at the beginning of the new cycle for the formation of a new charge packet 29 having a fixed size. Due to the fact that the charge packet 31 does not require a separate drain, below which the electrode can be retransferred, the electrodes 18–21 can be arranged consecutively in a row and ramifications in the charge transport channel, whereby angles are introduced into the charge transport, can be avoided. The device is therefore particularly suitable for high-frequency applications. It should be noted that the conversion of the signal S into a corresponding charge packet takes place at the edge of the clock $\phi_1$ around the instant $t_6$ and hence is frequency-independent. When therefore the time intervals in which the clocks $\phi_1 \ldots \phi_4$ are constant become smaller, this will not influence the signal formation with an unchanged slope of the edge of the clocks. FIG. 3b shows a function of time high-frequency clocks $\phi_{1n}$; $\phi_1$–$\phi_4$, which vary practically sinusoidally. The signal formation in this case takes place in the same manner as with the clocks shown in FIG. 3a at the trailing edge of $\phi_1$ around the indicated instant $t_6$. With unchanged slopes of the edges, the conditions in which the signal-dependent charge packet is formed are at least practically identical to each other and are therefore independent of the clock frequency.

As appears from the plan view, the input part of the channel 4 is wider than the succeeding part of the channel. In this manner, it can be achieved that, even though only a part of the fixed charge packet 29 is used for the further signal processing, nevertheless a larger relative part of the charge storage capacity of the channel is utilized. Instead of by a wider input part, this may also be obtained in a different manner, for example by a suitable choice of the voltages applied in the input part.

It will be appreciated that the invention is not limited to the embodiment described herein, but that many variations are possible for those skilled in the art without departing from the scope of the invention. For example, in the embodiment described herein, the difference between two signals may also be converted into a charge packet by supplying one signal to the electrode 19 and the other signal to the electrode 21.

What is claimed is:

1. A charge-coupled device comprising a charge transport channel defined at the surface of a semiconductor body and an input stage for supplying signal-dependent charge packets comprising an input diode for supplying charge carriers, a first electrode arranged above the charge transport channel for forming a charge packet having a fixed signal-independent size, and second, third and fourth electrodes located above the charge transport channel, the second, third and fourth electrodes being connected to means for applying voltages in such a manner that a potential well extending below these electrodes can be induced, to which the charge packet having a fixed size can be transferred, these means comprising a voltage source by means of which a signal-dependent voltage difference can be applied between the second and the fourth electrode, as a result of which signal-dependent quantities of charge are stored below the second and the fourth electrode, from which complementary charge packets can be formed by applying such a voltage to the third electrode that below this electrode a potential barrier is formed, which insulates the charge packets below the second and the fourth electrode from each other, characterized in that said electrodes are disposed one to four in a consecutive arrangement in such a manner that the second electrode is located between the first and third electrodes, and in that means are provided for transferring the charge packet formed below the second electrode back to the region below the first electrode before a charge packet having a fixed size is formed again below this electrode.

2. A charge-coupled device as claimed in claim 1, characterized in that the signal-dependent voltage difference between the second and the fourth electrode is obtained from a signal S, which is supplied in the form $+S$ to one of said electrodes and in the form $-S$ to the other of said electrodes.

3. A charge-coupled device as claimed in claim 1 or 2, characterized in that the charge transport channel has at the area of the input part below the first, second, third and fourth electrodes a larger width than the succeeding part of the charge transport channel.

4. A charge-coupled device as claimed in claim 1 or 2, characterized in that the first electrode is connected to the clock electrode which, viewed in the charge transport direction, is arranged beside and next to the fourth electrode.

* * * * *